United States Patent [19]

Takahashi et al.

[11] Patent Number: 5,748,024
[45] Date of Patent: May 5, 1998

[54] LEVEL CONVERTOR

[75] Inventors: Yutaka Takahashi; Manabu Niiyama; Yoshiki Goto, all of Sendai, Japan

[73] Assignee: Fujitsu Limited, Kawasaki, Japan

[21] Appl. No.: 530,483

[22] Filed: Sep. 19, 1995

[30] Foreign Application Priority Data

Feb. 22, 1995 [JP] Japan ................................. 7-033218

[51] Int. Cl.⁶ ..................................................... H03K 19/02
[52] U.S. Cl. ............................. 327/333; 327/379; 326/58
[58] Field of Search ........................... 327/333, 108–111, 327/379, 383, 387, 388; 326/56–58, 68

[56] References Cited

U.S. PATENT DOCUMENTS

| | | | |
|---|---|---|---|
| 4,939,392 | 7/1990 | Shubat et al. | 326/58 |
| 4,975,597 | 12/1990 | Houston | 326/58 |
| 5,151,621 | 9/1992 | Goto | 326/58 |
| 5,225,723 | 7/1993 | Drako et al. | 326/58 |
| 5,231,318 | 7/1993 | Reddy | 326/56 |
| 5,341,045 | 8/1994 | Almulla | 327/333 |

FOREIGN PATENT DOCUMENTS

| | | | |
|---|---|---|---|
| 3179814 | 8/1991 | Japan | 327/333 |
| 5007139 | 1/1993 | Japan | 327/391 |
| 6037623 | 2/1994 | Japan | 327/333 |

Primary Examiner—Timothy P. Callahan
Assistant Examiner—Eunja Shin
Attorney, Agent, or Firm—Greer, Burns & Crain, Ltd.

[57] ABSTRACT

A level convertor is provided between circuits, which act with different power supply voltages, respectively, and converts a first voltage level of an output of a circuit to a second voltage level, which corresponds to an operational voltage level of another circuit. The level convertor comprises a level shift circuit, which receives the first voltage level and outputs an output of the second voltage level, and a buffer circuit, which receives the output of the second level and a control signal, and fixes the output of the second voltage level to a low logic level, when the control signal is a low logic level. The control signal may be used to set a timing for registering the data to a register, avoiding data in an instable state when power is supplied, from being registered to the register.

8 Claims, 9 Drawing Sheets

FIG. 1A
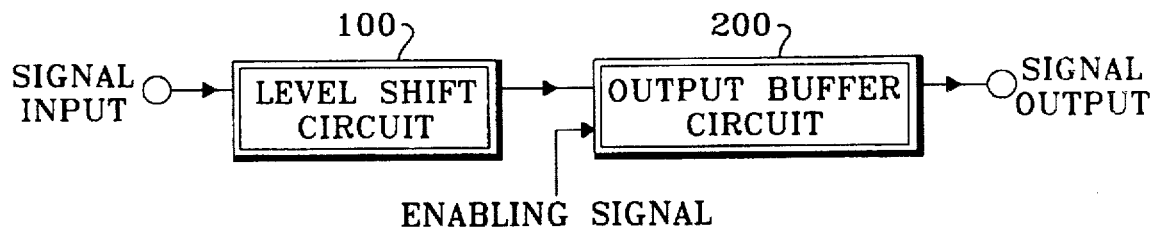
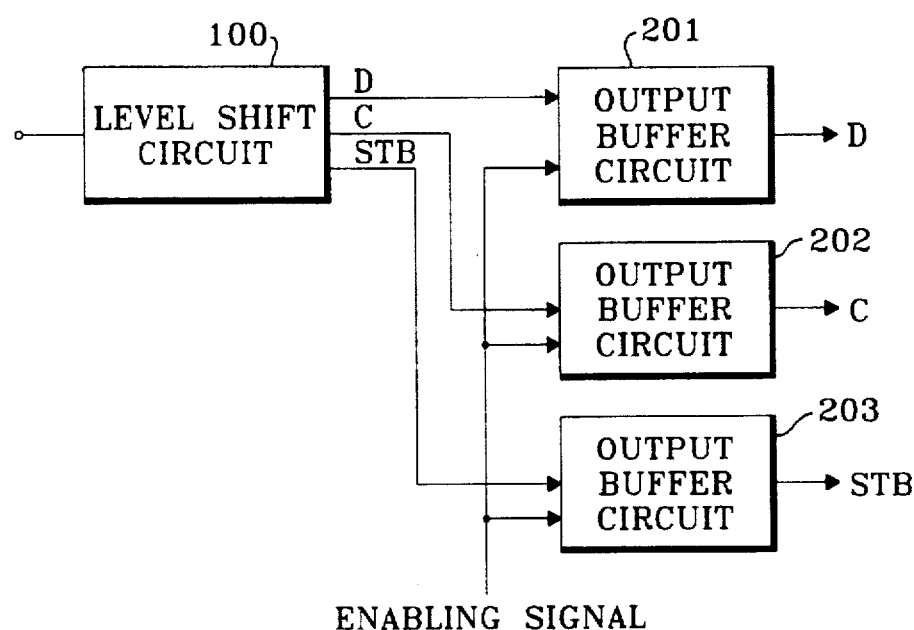
FIG. 1B

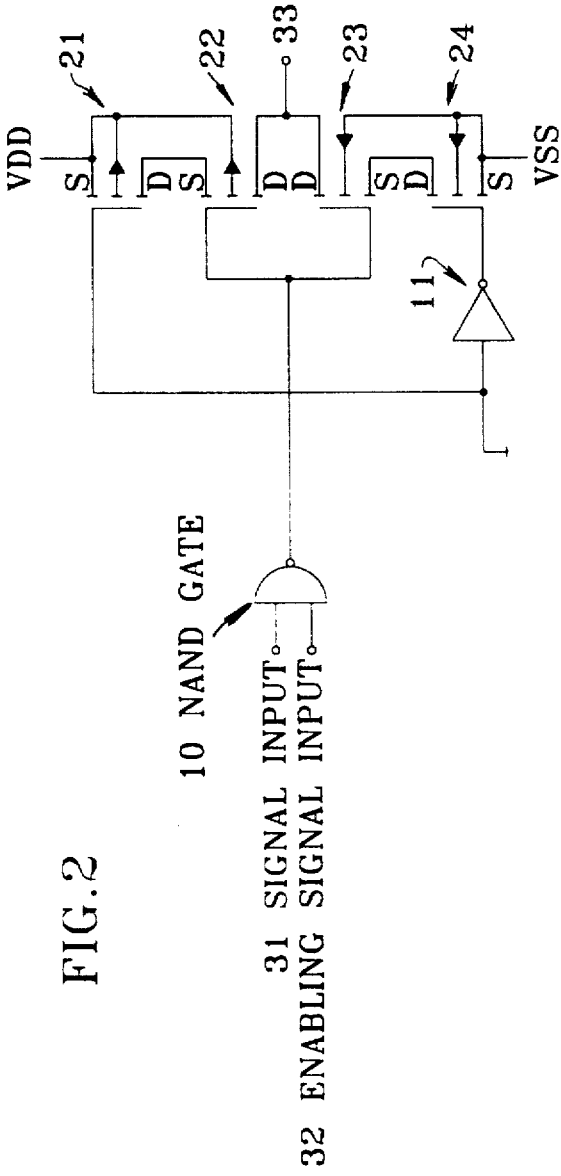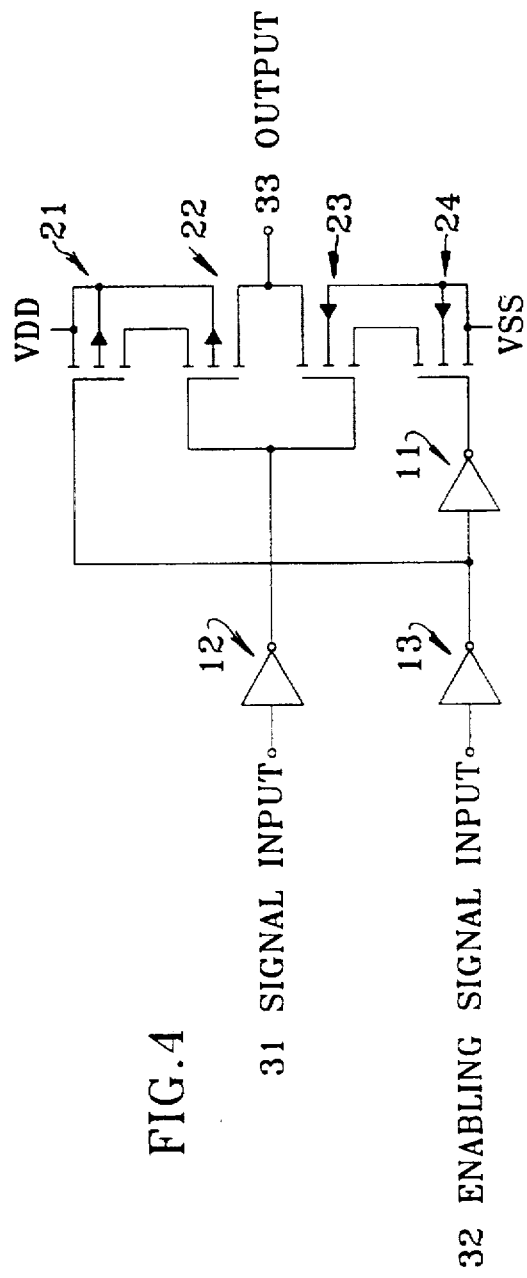

FIG. 3

| 31 INPUT | 32 ENABLE | 21 FET | 24 FET | 33 OUTPUT |
|---|---|---|---|---|
| L H | L | ON | ON | L |
| L | H | ON | ON | L |
| H | H | ON | ON | H |

FIG. 5

| 31 INPUT | 32 ENABLE | 21 FET | 24 FET | 33 OUTPUT |
|---|---|---|---|---|
| L H | L | OFF | OFF | Z |
| L | H | ON | ON | L |
| H | H | ON | ON | H |

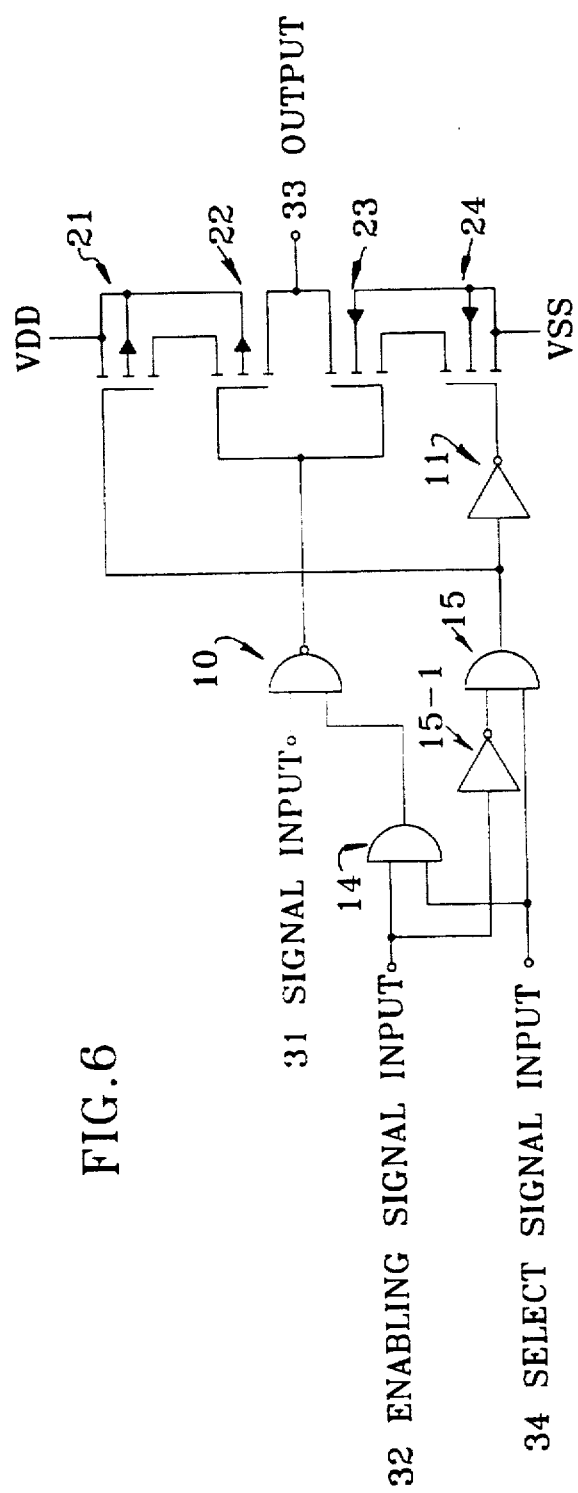

WHEN SUPPLYING A POWER 3V/5V CONV. IC OUTPUTS AN IRREGULAR PULSE

LEVEL CONVERTOR

BACKGROUND OF THE INVENTION

Field of the Invention

The present invention relates to a level convertor. More particularly, it relates to a level convertor provided between first and second circuits, which are supplied with different power supply voltages, respectively, and the second circuit is located on the latter stage of the first circuit. The level convertor converts an output level of the first circuit to an operational level of the second circuit.

In recent years, portable type electronics devices, such as a portable telephone, a note type personal computer or the like have been widely used, and low voltage-type circuit devices, which are driven by a low voltage such as 3 volts have been required to minimize current consumption of the electronics devices and to make batteries used in the electronics devices last for longer time.

However, it is not always possible to use only low voltage type circuit devices and occasionally, a conventional circuit device, which is driven by a higher voltage power supply of 5 volts has to be employed under a certain condition.

Accordingly, there is possibility that the low voltage type circuit devices of 3 volt power supply and the conventional circuit devices of 5 volt power supply are mixed in an electronics device.

Therefore, a level converting device is employed to transmit and receive signals of different voltages between the circuit devices.

Now, for example, it is prescribed in a 3 V circuit that is driven by 3 V power supply that voltage more than 2.1 V is H level and the voltage less than 0.6 V is L level. It is also prescribed in a 5 V circuit that is driven by 5 V power supply that voltage more than 3.5 V is H level and the voltage less than 1.0 V is L level. In this case, a H-level input signal of more than 2.1 V sent from the 3 V circuit to the level converting device is converted to a H-level signal of 3.5 V, while a L-level signal is not changed.

Further, a H-level input signal of more than 3.5 V sent from the 5 V circuit device is converted to a signal of 2.1 V, while a L-level signal of less than 1.0 V is converted to a signal of 0.6 V, and the converted signals of 2.1 V and 0.6 V are sent to the 3 V circuit as a H-level signal and a L-level signal, respectively.

FIGS. 10A and 10B are a diagram and an operational time chart for explaining a problem of a conventional level convertor.

In FIG. 10A, a block diagram illustrating one model of a level convertor is shown. Further, FIG. 10B is a timing chart corresponding to the model shown in FIG. 10A. In FIG. 10A, the model has a buffer circuit, which acts as an inverter circuit with 3 V power supply on the first stage, and another buffer circuit, which also acts as an inverter circuit with 5 V power supply on the second stage.

The case where an input of the first buffer circuit, which acts with 3 V power supply, is low level as shown in ① of FIG. 10B will be considered.

Under the above-described situation, when power is supplied, the power supply of 3 V rises as shown in FIG. 10B, whereas the power supply of 5 V rises faster than the rising of the power supply of 3 V.

Accordingly, the output of the second buffer circuit on the side of the power supply of 5 V, as shown in FIG. 10B, is reversed from L level to H level, because the power supply of 5 V rises faster than that of 3 V. When the power supply of 3 V rises, the output of the first buffer circuit becomes H level. Accordingly, the output of the second buffer circuit of 5 V returns to L level again.

In this way, it becomes apparent from FIG. 10B that a pulse signal is outputted from the second buffer circuit of 5 V on its transient state at the rise timing of the different power supplies 3 V and 5 V.

During the time the first buffer circuit, which acts with the power supply of 3 V, is in L level, the second buffer circuit of the 5 V circuit outputs an unnecessary pulse.

More particularly, the cause of and problems due to the unnecessary pulse will be considered by employing an example of a portable telephone as follows.

FIG. 11 is a principle diagram of a portable telephone. In FIG. 11, reference numeral 1 is a level convertor, which is an object of the present invention. A radio-stage controller 2 is formed of a demodulator DEM, a synchronizing circuit SYN, an AFC modulator AFC, a modulator MOD, a transmitter TX, a receiver RX, a power amplifier PA or the like. The radio-stage controller 2 acts with a 5 V power supply.

A control unit 3 has a function of controlling an entire system of the portable telephone. In this example, such exclusive control unit is structured to act with a 3 V power supply. Therefore, a signal outputted from the control unit (CU) 3 is sent to the radio-stage controller 2 after the voltage is converted to 5 V in the level convertor 1.

Reversely, when the output signal from the radio-stage controller 2 is sent to the control unit 3, it is required that the signal, of which voltage is 5 V, be converted to 3 V by the level convertor 1.

Further, in FIG. 11, a voltage supply circuit 4 is a power supply for distributing a voltage supplied from a battery 7.

The output voltage supplied from the power supply 4 is inputted to a DC/DC convertor 5. The DC/DC convertor 5 converts the voltage of 5 V to 3 V. Further, the voltage of 5 V is supplied to the radio-stage controller 2 and a latter circuit portion of the level convertor.

On the other hand, the output voltage, which is converted to 3 V, supplied from the DC/DC convertor 5 is simultaneously supplied to the level convertor 1, and the voltage is further supplied to the control unit 3.

In FIG. 11, a reset circuit 6 gives a trigger signal to reset the states of the radio-stage controller 2, the level convertor 1 and the control unit 3 while the power is ON.

As described in the block diagram illustrating the principle of the portable telephone as shown in FIG. 11, the DC/DC convertor 5 converts the voltage of 5 V to 3 V as described above. Therefore, as shown in FIG. 10B, the 5 V voltage previously rises, and the 3 V voltage is outputted after being converted by the DC/DC convertor 5 with a constant delay time.

As shown in FIG. 11, the DC/DC convertor 5 converts the voltage of 5 V, which is outputted from the power supply 4, to 3 V to obtain two of the different voltages 3 V and 5 V. Therefore, a time lag between the rise times of 5 V and 3 V is generated.

Under the condition shown in FIGS. 10A and 10B, the output signal of the level convertor 1 generates a pulse type noise output on a time lag between the rise times of 5 V and 3 V.

Further, in the portable telephone as shown in FIG. 11, data are transferred per one byte data DATA to each circuit as a serial signal on a normal state, as shown in FIG. 12, by synchronizing with a clock signal CLK as a serial signal.

Further, on a required status, after completing to shift the 8-bits data, the data are set to an appropriate resistor or the like by a strobe signal STB.

For example, in the portable telephone, a registration processing, in which each portable telephone registers its location to a base station, is performed. In this case, after registration, an unnecessary noise pulse is generated by supplying the power as shown in FIGS. 10A and 10B.

Accordingly, the unnecessary noise pulse exerts a bad influence upon the data shifting on the normal status, as shown in FIG. 12A, and upon the setting of states by the use of the strobe signal STB after completing to shift the data.

For example, the location registration data are set to the register by the strobe signal STB after location registered data are shifted and the data shifting is completed, thereby completing the location registration. However, as shown in FIG. 12B, the data are in an instable status, when supplying the power, until the location registration is completed.

In the instable status when supplying the power, an irregular pulse is outputted from the 3 V/5 V convertor as shown in FIG. 10 [refer to STB in FIG. 12B]. The irregular pulse is suspectedly equal to a strobe pulse STB in FIG. 12A. Therefore, an instable status, when supplying the power, is set to the register for location registration. Thus, a lock of AFC is out, so that it is difficult to communicate.

SUMMARY OF THE INVENTION

Accordingly, it is an object of the present invention to provide a level convertor to solve the above-described problem confronted in designing a level convertor, when supplying the power.

A level convertor according to the present invention, provided between first and second circuits, which act with different power supply voltages respectively, for converting a first voltage level of an output of the first circuit to a second voltage level, which corresponds to an operational voltage level of the second circuit, comprises, a level shift circuit operatively connected to the first circuit for receiving the output of the first voltage level from the first circuit and outputting an output of the second voltage level, and a buffer circuit for receiving the output of the second level and a control signal, and fixing the output of the second voltage level to a low-logic level, when the control signal is a low-logic level.

Further, other objects of the present invention will become clear by the description for explaining embodiments according to the attached drawings.

BRIEF DESCRIPTION OF THE DRAWINGS

FIGS. 1A and 1B are block diagrams showing a principle of the present invention.

FIG. 2 is a diagram illustrating a first embodiment of a buffer circuit in the level convertor according to the present invention.

FIG. 3 shows a truth table of the output logic corresponding to the first embodiment of FIG. 2.

FIG. 4 is a diagram illustrating a second embodiment of FIG. 2.

FIG. 5 shows a truth table of the output logic corresponding to the second embodiment of FIG. 3.

FIG. 6 is a buffer circuit according to a third embodiment of the present invention.

FIG. 7 shows a truth table of the output logic corresponding to the third embodiment of FIG. 6.

DESCRIPTION OF THE PREFERRED EMBODIMENTS

Figure 8:
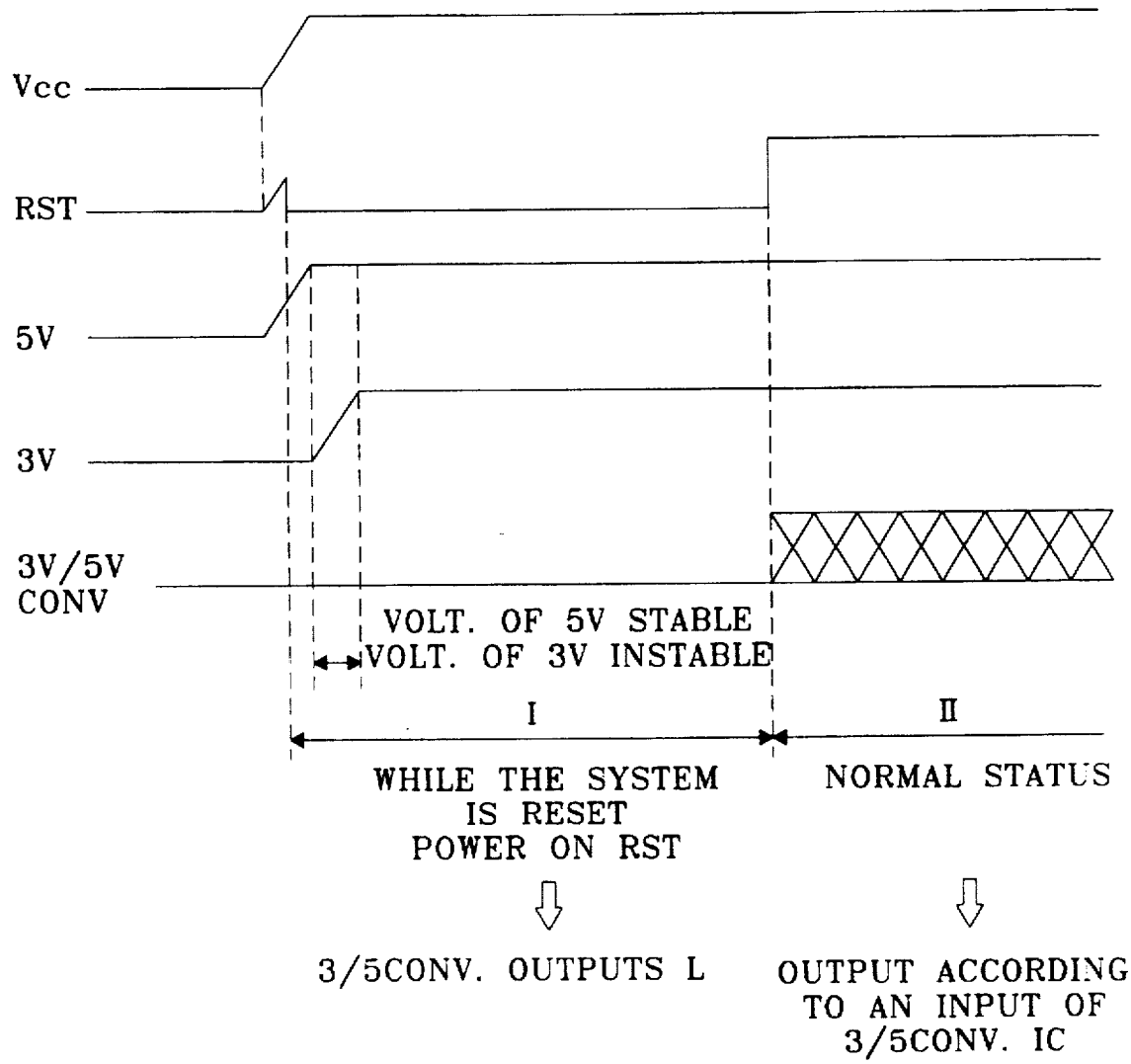
FIG. 8 shows an operational time chart of the buffer circuit shown in FIG. 2.

Throughout the following descriptions, the same reference numerals are used to denote and identify corresponding or identical components.

FIGS. 1A and 1B are block diagrams showing a principle of the present invention. In FIG. 1A, a level shift circuit 100 is connected to a buffer circuit 200 in tandem, as a structure of the present invention.

A signal outputted from a circuit located on a preceding portion is inputted to the level shift circuit 100 to convert the signal to a predetermined level, which corresponds to an operational voltage level of the buffer circuit 200, and an output signal of the level shift circuit 100 is led to the buffer circuit 200.

An enabling signal is inputted to the buffer circuit 200. When the logic of the enabling signal is L level, the signal outputted from the output buffer circuit 200 is fixed to L level. It is possible to prevent from generating a noise pulse on unnecessary pulse as explained regarding the prior art on the transient state, when supplying the power, by setting the logic of the enabling signal to L level.

Figure 12A:
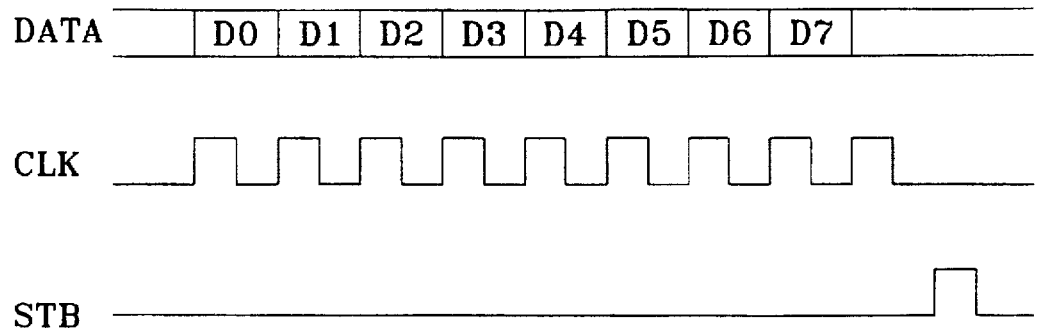
FIGS. 12A and 12B are time charts explaining the effect of the problem described in FIGS. 10A and 10B on the portable telephone of FIG. 11.
Figure 12B:
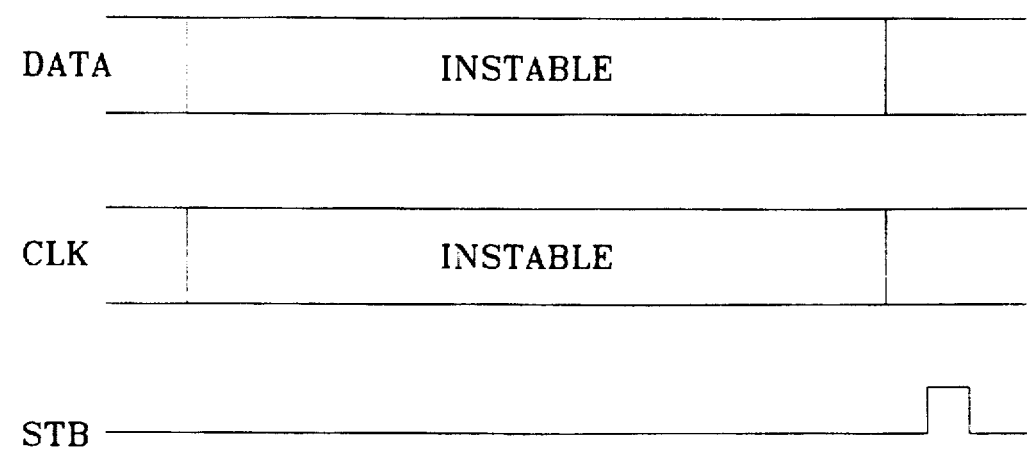

In this embodiment, data, clock and strobe signals are outputted from the level shift circuit 100, as shown in FIG. 12.

Although in the example of FIG. 1B, the signal level shift circuit 100 is shown to output data, clock and strobe signals, it is contemplated that three separate level shift circuits may be provided which respectively output data, clock and strobe signals. The level shift circuit 100 can be a commercially available micro-controllers, such as a Fujitsu MB88371 micro-controller.

In FIG. 1B, the buffer circuits 201, 202 and 203 are provided in correspondence to the data, clock and strobe signals outputted from the level shift circuit 100 as shown in FIG. 1B. An enabling signal is commonly inputted to the buffer circuits 201 to 203.

Further, the buffer circuits 201 to 203 can be realized with a common structure. The structure of the output buffer circuit will be explained as follows.

FIG. 2 is a diagram illustrating a first embodiment of the buffer circuit in the level convertor according to the present invention.

In FIG. 2, an input signal 31 and an enabling signal 32 are inputted to a NAND gate 10. The output from the NAND gate 10 is sent to a C-MOS inverter formed of a Pch type FET 22 and a Nch type FET 23, of which gates are commonly connected, and drains are commonly connected to an output terminal 33.

The source of a FET 21 is connected to a drain power supply VDD, and the drain electrode is connected to the source of the FET 22. On the other hand, the Nch type FET 23 is connected to the drain of a FET 24, of which source is the same conductive type as that of the Nch type FET 23. Further, the gates are connected to the FETs 22 and 23 in common.

Further, the source of the Nch FET 24 is connected to the source power supply VSS.

The gates of the FETs 22 and 23 are connected in common, and the gates are connected to the output of the NAND gate 10. Further, the gate of the FET 21 is directly connected to the ground potential, and the gate of the FET 24 is connected via an inverter 11 to the ground potential.

In the circuit shown in FIG. 2, when a logic of either a data input 31 or an enabling signal input 32, each of which is inputted to terminals of the NAND gate 10, is L level, the output logic of the NAND gate 10 becomes H level. Therefore, the output 33 of the C-MOS inverter, which is formed of a Pch type FET 22 and a Nch type FET 23, becomes L level.

FIG. 3 shows a truth table illustrating the relationship of the output logic for the circuit of FIG. 2. It is apparent from FIG. 3 that the output 33 of the C-MOS inverter becomes L level, regardless of the logic of the signal sent from the level shift circuit 100, when the logic of the enabling signal becomes L level.

Accordingly, when supplying the power, it is possible to prevent a transient state from being instable by setting the logic of the enabling signal to L level.

FIG. 4 shows a buffer circuit according to a second embodiment of the present invention. In FIG. 4, the buffer circuit also has FETs 21 to 24 and an inverter 11, as the same as the first embodiment shown in FIG. 2.

More particularly, the buffer circuit shown in FIG. 4 has an inverter 12, to which the output data 31 of a preceding circuit is inputted, and an inverter 13, to which the enabling signal 32 is inputted, instead of the NAND gate 10 in the buffer circuit shown in FIG. 2.

In this embodiment, when the logic of the enabling signal 32 is L level, the output of the inverter 13 becomes H level. Therefore, the FETs 21 and 24 become OFF, thus showing high impedance. Therefore, the output 33 of the C-MOS inverter, which is formed of the FETs 22 and 23 can be constant, regardless of the level of the logic of the input signal 31. FIG. 5 shows a truth table of the relationship of the logic shown in FIG. 4.

FIG. 6 shows a buffer circuit according to a third embodiment of the present invention. The buffer circuit according to the third embodiment also has FETs 21 to 24 and an inverter 11, in the same way of the first and second embodiments.

The buffer circuit of the third embodiment also has a NAND gate 10, in the same way of the first embodiment. However, the output data of the preceding circuit are inputted to one input terminal of the NAND gate 10, and the OR outputs of the enabling signal 32 and the select signal 34 are inputted to other input terminal.

Further, the buffer circuit in the third embodiment has an AND gate 15, to which the enabling signal 32, via an inverter 15-1, and the select signal 34 are inputted. In the structure according to the third embodiment, FIG. 7 shows a truth table showing the relationship between input and output.

It is apparent from the truth table that the circuit functions as the same as that of the first embodiment shown in FIG. 2, when the logic of the select signal 34 is L level, and further, the circuit functions as the same as that of the second embodiment shown in FIG. 3, when the logic of the select signal 34 is H level. In this way, the form of use of the third embodiment can be changed by the select signal 34, so that it is possible to provide a circuit, which can select interfaces with the applied peripheral circuit, freely.

This embodiment also allows the output 33 to be determined by the enabling signal 32 when this signal is at H level regardless of the logic of the select signal 34. Accordingly, the truth table of FIG. 7 shows the select signal 34 being indicated with an "X" to denote a "don't care" state when the enabling signal 32 is at H level.

Figure 9:
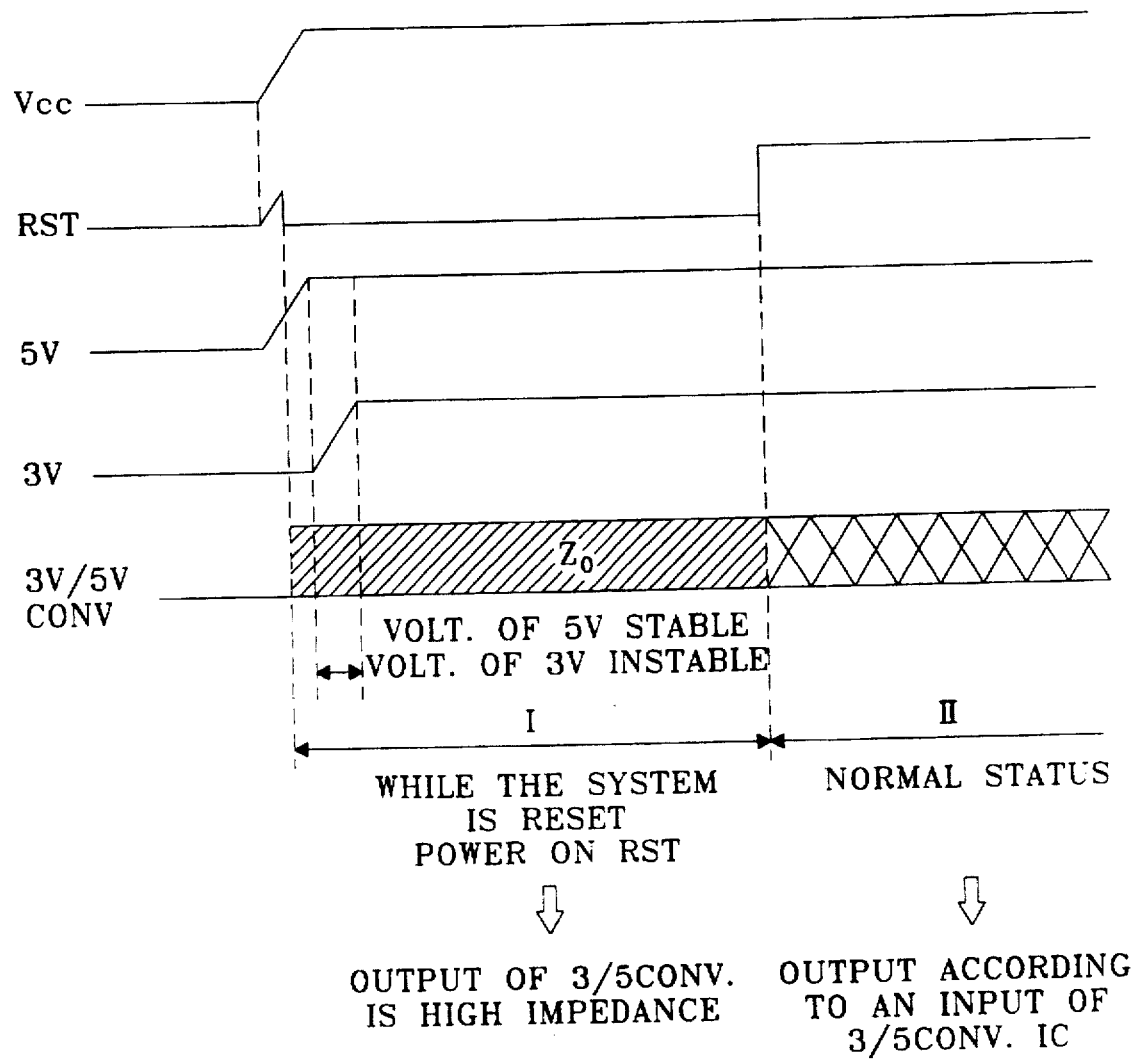
FIG. 9 shows an operational time chart of the buffer circuit shown in FIG. 3.
Figure 10A:
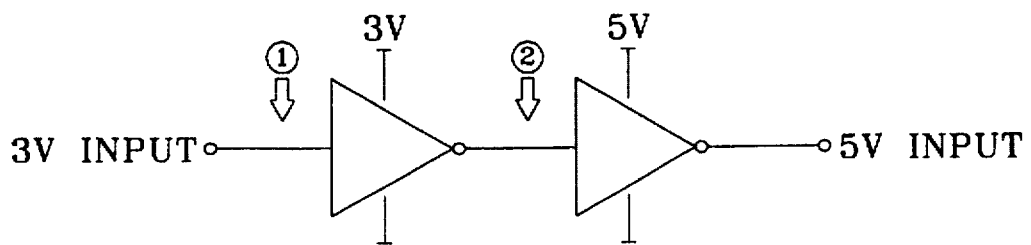
FIG. 10A is a diagram explaining a problem confronted in designing a level convertor.
Figure 10B:
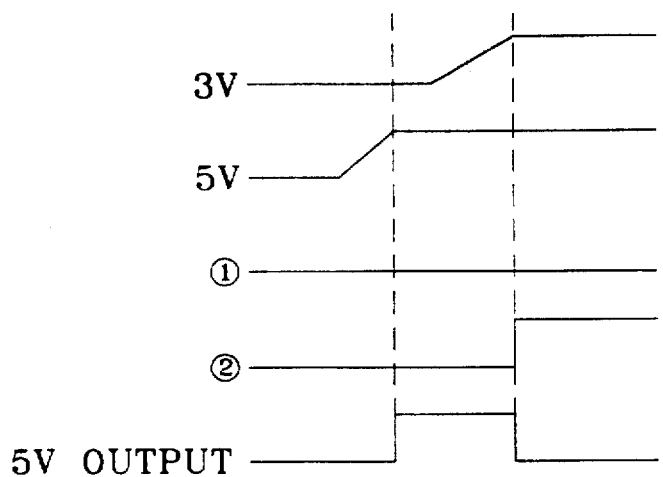
FIG. 10B is an operational timing chart of the diagram of FIG. 10A.
Figure 11:
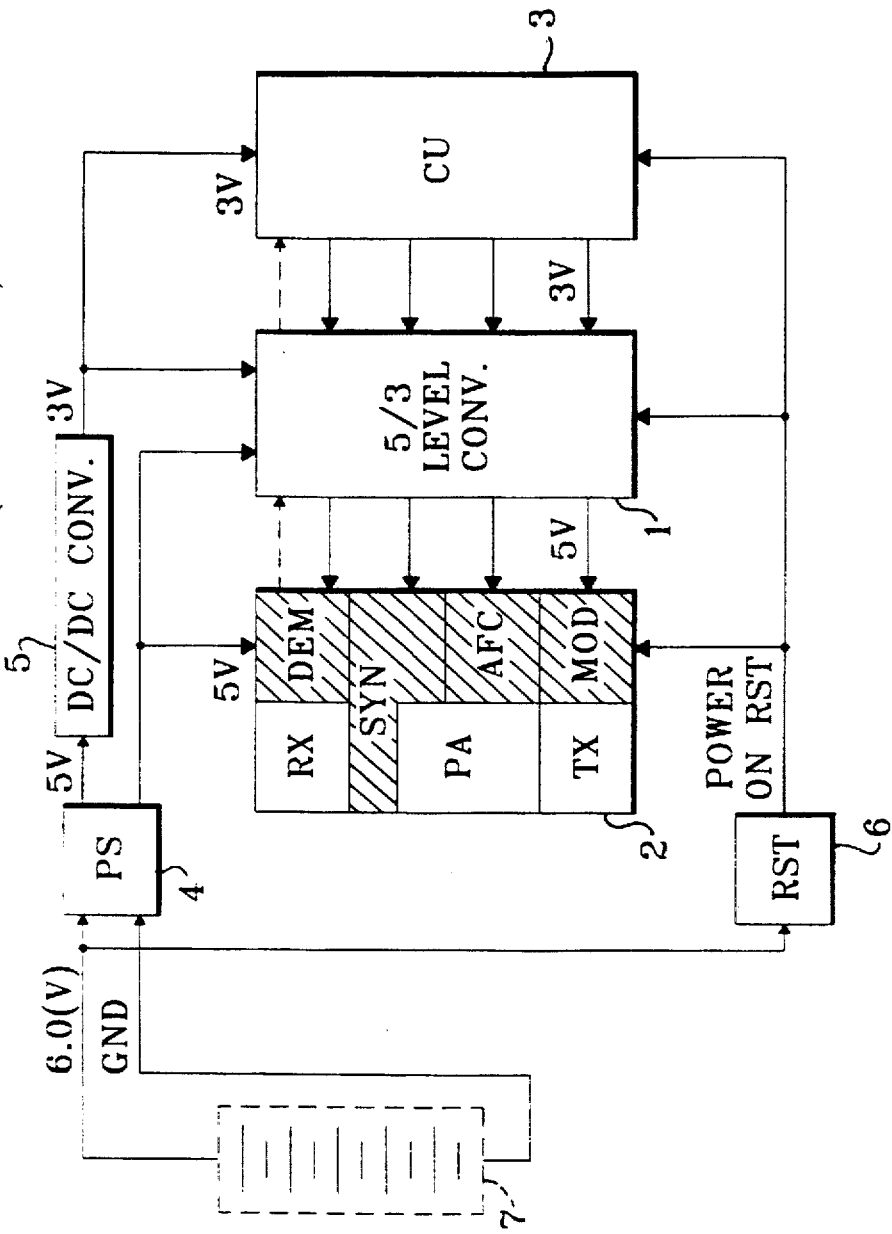
FIG. 11 is a principle diagram of a portable telephone.

FIGS. 8 and 9 show operational time charts when the present invention is applied to the level convertor 1 shown in FIG. 11.

The drawing shown in FIG. 8 shows an operational time chart when applying the first embodiment. While the system is reset (I), the enabling signal is set to L level. Accordingly, as shown in FIG. 2, the output of the level convertor is set to L level, while the system is reset (I). After the voltages of 5 V and 3 V become stable, and the period of system reset has terminated (II), the output according to the logic level of the inputted data can be obtained.

FIG. 9 shows an operational time chart when applying the second embodiment. While the system is reset (I), the enabling signal is simultaneously set to L level. Accordingly, as shown in FIG. 4, the output of the level convertor becomes high impedance Zo. After the voltages of 5 V and 3 V become stable, and the period of system reset has been terminated (II), the output according to the logic level of the inputted data can be obtained.

Further, an operational time chart, when applying the third embodiment, is not shown in the diagram. However, as shown in FIG. 6, when the select signal is L level, the operational time chart is the same as that shown in FIG. 8. Further, when the select signal is H level, the operational time chart is the same as that shown in FIG. 9.

As explained according to the embodiments, in the level convertor according to the present invention, for example, it is possible to prevent noise or an unnecessary pulse from being generated by the level convertors' which noise is generated due to the difference between the rise and fall times of two of different voltages.

Therefore, the problem, such as a location registration information in a portable telephone being rewritten by the noise generated when supplying the power, can be solved.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes that come within the meaning and range of equivalency of the claims are therefore intended to be embraced therein.

What is claimed is:

1. A level converter provided between first and second circuits which act with different power supply voltages, respectively, for converting a first voltage level of a first output signal of the first circuit to a second voltage level which corresponds to an operational voltage level of the second circuit, the level converter comprising:

a level shift circuit, operatively connected to the first circuit, for receiving and converting the first output signal of the first voltage level from the first circuit to a second output signal of the second voltage level; and a buffer circuit, operatively connected to the level shift circuit, including a NAND gate having a first input terminal, to which the second output signal of the second voltage level is supplied from the level shift circuit and a second input terminal, to which a control signal is supplied, for outputting a NAND logic output of the second output signal and the control signal, and an inverter circuit for receiving the NAND logic output from the NAND gate and outputting an inverted output, said inverted output being fixed to a low logic level when the control signal has a low logic level, wherein the second circuit is a register circuit which sets a buffered output of the buffer circuit by a timing of the control signal.

2. The level converter according to claim 1, wherein the inverter circuit has first and second power terminals, and the buffer circuit further includes a first variable impedance connected between the first power terminal of the inverter circuit and a first power supply voltage, and a second variable impedance connected between the second power terminal of the inverter circuit and a second power supply voltage, the first and second variable impedances being set to have a high impedance value.

3. The level converter according to claim 2, wherein the inverter circuit is a CMOS inverter having a common gate, to which the NAND logic output from the NAND gate is inputted.

4. A level converter provided between first and second circuits which act with different power supply voltages, respectively, for converting a first voltage level of a first output signal of the first circuit to a second voltage level which corresponds to an operational voltage level of the second circuit, the level converter comprising:

a level shift circuit, operatively connected to the first circuit, for receiving and converting the first output signal of the first voltage level from the first circuit to a second output signal of the second voltage level; and a buffer circuit, operatively connected to the level shift circuit, including a first inverter for inverting the second output signal of the level shift circuit, a second inverter having first and second terminals for inverting a first inverter output signal from the first inverter, a first variable impedance connected between the first terminal of the second inverter and a first power supply voltage, and a second variable impedance connected between the second terminal of the second inverter and a second power supply voltage, the first and second variable impedances being controlled to have a high impedance value according to a logic level of a control signal, wherein the second circuit is a register circuit which sets a buffered output of the buffer circuit by a timing of the control signal.

5. The level converter according to claim 4, wherein the second inverter is a CMOS inverter having first and second FETs, the first FET having a first conductivity type and a first gate, and the second FET having a second conductivity type and a second gate, the first conductivity type and second conductivity type being different and the first gate and the second gate being commonly connected, the first variable impedance is a third FET having a third conductivity type same as that of the first conductivity type and having a third gate supplied with the control signal, and the second variable impedance is a fourth FET having a fourth conductivity type same as that of the second conductivity type and having a fourth gate supplied with an inverted control signal.

6. A level converter provided between first and second circuits, which act with different power supply voltages respectively, for converting a first voltage level of a first output of the first circuit to a second voltage level which corresponds to an operational voltage level of the second circuit, the level converter comprising:

a level shift circuit operatively connected to the first circuit for receiving the first output of the first voltage level from the first circuit and outputting a second output of the second voltage level; and a buffer circuit, operatively connected to the level shift circuit, including a NAND gate having first and second input terminals, the first input terminal being supplied with the second output of the level shift circuit, an inverter circuit having first and second power terminals for receiving and inverting a NAND logic output of the NAND gate, a first variable impedance connected between the first power terminal of the inverter circuit and a first power supply voltage, a second variable impedance connected between the second power terminal of the inverter circuit and a second power supply voltage, an OR logic gate having a first OR input terminal, to which a control signal is supplied and a second OR input terminal, to which a select signal is supplied, for generating and supplying an OR logic output of the control signal and the select signal to the second input terminal for the NAND gate so that the NAND logic output may be selected; and an AND gate having a first AND input terminal, to which the control signal is supplied via a first inverter and a second AND input terminal, to which the select signal is supplied, for supplying an AND logic output of the control signal inverted by the first inverter and the select signal to the first variable impedance and to the second variable impedance via a second inverter to control the first and second variable impedances to have high impedance values when the control signal has a low logic level.

7. The level converter according to claim 6, wherein the inverter circuit is a CMOS inverter having first and second FETs, the first FET having a first conductivity type and a first gate, and the second FET having a second conductivity type and a second gate, the first conductivity type and second conductivity type being different and the first gate and the second gate being commonly connected, the first variable impedance is a third FET having a third conductivity type same as that of the first FET and having a third gate supplied with the NAND logic output from the NAND gate, and the second variable impedance is a fourth FET having a fourth conductivity type same as that of the second FET and having a fourth gate supplied with an inverted signal of the AND logic output from the AND gate.

8. The level converter according to claim 7, wherein the second circuit is a register circuit, which sets a buffered output of the buffer circuit by a timing of the control signal.

* * * * *